(12) United States Patent
Parikh et al.

(10) Patent No.: US 9,053,957 B2
(45) Date of Patent: *Jun. 9, 2015

(54) STRUCTURE AND METHOD FOR CREATING A REUSABLE TEMPLATE FOR DETACHABLE THIN FILM SUBSTRATES

(71) Applicant: Solexel, Inc., Milpitas, CA (US)

(72) Inventors: Suketu Parikh, San Jose, CA (US); David Dutton, Milpitas, CA (US); Pawan Kapur, Burlingame, CA (US); Somnath Nag, Saratoga, CA (US); Mehrdad M. Moslehi, Los Altos, CA (US); Karl-Josef Kramer, San Jose, CA (US); Nevran Ozguven, Mountain View, CA (US); Burcu Ucok, Milpitas, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/897,323

(22) Filed: May 17, 2013

(65) Prior Publication Data

US 2013/0241038 A1    Sep. 19, 2013

Related U.S. Application Data

(63) Continuation of application No. 12/786,262, filed on May 24, 2010, now Pat. No. 8,445,314.

(60) Provisional application No. 61/180,623, filed on May 22, 2009.

(51) Int. Cl.
  *H01L 29/06* (2006.01)
  *H01L 31/0236* (2006.01)
  *H01L 31/18* (2006.01)
  *H01L 21/02* (2006.01)

(52) U.S. Cl.
  CPC ........ *H01L 29/0692* (2013.01); *H01L 31/0236* (2013.01); *H01L 31/1804* (2013.01); *Y02E 10/547* (2013.01); *H01L 21/0243* (2013.01)

(58) Field of Classification Search
  CPC ............ H01L 21/0243; H01L 29/0692; H01L 31/0236; H01L 31/1804
  USPC ............ 257/623; 438/97, 458, 488, 500, 502, 438/507, 509
  See application file for complete search history.

(56) References Cited

U.S. PATENT DOCUMENTS

2003/0017712 A1*    1/2003   Brendel ........................ 438/758

* cited by examiner

*Primary Examiner* — Daniel Shook

(57) ABSTRACT

A structure and method operable to create a reusable template for detachable thin semiconductor substrates is provided. The reusable template has a three-dimensional (3-D) surface topography comprising a plurality of raised areas comprising a rounded top and separated by a plurality of depressed areas.

6 Claims, 15 Drawing Sheets

STRUCTURE AND METHOD FOR CREATING A REUSABLE TEMPLATE FOR DETACHABLE THIN FILM SUBSTRATES

CROSS-REFERENCE TO RELATED APPLICATIONS

This application is a continuation of U.S. patent application Ser. No. 12/786,262 filed on May 24, 2010 which claims the benefit of U.S. Provisional Pat. App. No. 61/180,263 filed on May 22, 2009, both of which are hereby incorporated by reference in their entirety.

TECHNICAL FIELD

This disclosure relates in general to the field of photovoltaics and solar cells, and more particularly to three-dimensional (3-D) thin-film solar cells (TFSCs) or substrates (TFSSs) and methods for manufacturing the same.

BACKGROUND

Renewable, high-efficiency, and cost-effective sources of energy are becoming a growing need on a global scale. Increasingly expensive, unreliable, and environmentally-risky fossil fuels and a rising global demand for energy, including electricity, have created the need for alternate, secure, clean, widely available, cost-effective, environmentally-friendly, and renewable forms of energy. Solar photovoltaic (PV) electricity generation using solar cells is uniquely suited to meet the needs of residential, commercial, industrial, and centralized utility applications. Key attributes that make solar energy attractive are the abundant, worldwide, point-of-use supply of sunlight, environmental friendliness, scalability (from milliwatts to megawatts), secure point-of-use generation of solar electricity, and excellent distributed energy economics. The sun provides more energy to the earth in one hour than the annual energy consumption of the entire world. Much of the earth's surface receives a significant amount of annual sun-hours which may be effectively harnessed for clean and secure electricity generation. A key driver for this market pull is a rising public awareness of environmentally-benign technologies. However, due to relatively low solar cell efficiencies (e.g., less than 12% for most thin-film technologies and roughly 12% to 18% for most crystalline silicon solar cell technologies), high costs of raw materials (e.g., silicon for crystalline silicon wafer solar cells) and manufacturing processes, limitations on cost-effective and efficient electrical storage, and a general lack of infrastructure to support solar cell proliferation, to date there has been limited use of this energy solution.

For commercial applications, cost of energy to the end-user (e.g., in cents/kWh for electricity) should be sufficiently low and comparable to or even better than that from utility grids using conventional electricity generation sources. The solar photovoltaic electricity generation may be substantially expanded if it achieves cost parity with conventional grid electricity. As the costs of solar cells and modules (typically expressed as $/W_p$) are reduced, grid-tied solar photovoltaic applications are gaining acceptance at an accelerated pace, making them an attractive option for significant proliferation in electricity generation.

In the price-sensitive solar cell market, two principal technology options exist. On the one hand, crystalline silicon (c-Si) wafers may serve as the basis for solar cell formation (currently accounting for more than 90% of the solar PV market). On the other hand, thin-film (amorphous and polycrystalline) technologies using silicon and other semiconductor absorber materials (such as amorphous silicon, CdTe, or CIGS) may offer significant cost advantages compared to crystalline silicon wafer-based solar cells. These different approaches are at opposite ends of the price-performance scale. Crystalline silicon wafers offer higher performance, but at higher costs (due to the relatively high cost of starting monocrystalline and multicrystalline silicon wafers). Thin-film technologies may offer lower manufacturing costs, but typically at lower performance levels (i.e., lower efficiencies). For both approaches, the price-per-watt typically increases as cell efficiencies rise (due to higher material and/or manufacturing costs).

The trend in the mainstream crystalline silicon (c-Si) wafer solar cell industry has been to scale down wafer thicknesses. Since Silicon material cost constitutes a substantial fraction of the total solar cell cost, reduction in the silicon volume per sola cell without compromising the performance is of paramount importance. The wafer thickness reduction, however, presents additional challenges related to mechanical rigidity, manufacturing yield, and solar cell efficiency. Despite its high cost, crystalline silicon (c-Si) technology still dominates the solar cell market, mainly due to higher efficiencies and synergies with the established microelectronics industry and supply chain. Currently, c-Si accounts for slightly over 90% of the solar cell market.

It is projected that through innovative cost reduction and efficiency enhancement methods, the cost of electricity derived from grid-connected rooftop solar photovoltaic modules may become comparable to the cost of electricity purchased from the utility grid in five to ten years. A 2005 survey of the commercially available monocrystalline silicon and multicrystalline silicon solar modules reports the solar module efficiencies then in the range of 9.1% to 16.1%, with a median efficiency value of about 12.5%. Commercial crystalline silicon modules usually show a rapid initial efficiency degradation of 1% to 3% (relative) due to various effects, including photo degradation effects in wafered solar cells (e.g., wafer minority carrier lifetime degradation). Average monocrystalline silicon wafer solar cell efficiencies are projected to increase to roughly 20.5% by 2012, from a current efficiency of roughly 16.5% (leading-edge commercially available monocrystalline silicon solar cell and solar module efficiencies are currently about 22.5% and 18%, respectively). Multicrystalline silicon wafer solar cell efficiencies are projected to increase to roughly 18% by 2012.

The polysilicon feedstock material cost has reduced recently. Thus, any competing solar cell technologies should benchmark their manufacturing cost goals against this reduced raw material cost number. For a given cell efficiency, silicon wafer thickness reduction presents a prime opportunity for solar cell cost reduction by reducing the amount of polysilicon feedstock consumed per watt of peak solar power.

The cost associated with wire saws provides another wafer-related cost component for silicon wafer solar cells. Innovative and cost-effective technologies that eliminate the kerf losses associated with sawing and slicing should further facilitate silicon solar cell cost reductions. The overall cost reductions for wafer-based crystalline silicon solar cells may come from various sources including: lower cost polysilicon feedstock, thinner wafers, higher cell-level efficiencies, reduced wafer sawing kerf losses, and increased economy of scale or manufacturing volume.

State-of-the-art silicon wafer solar cell fabrication facilities ("solar fabs") typically produce 125 mm×125 mm up to 156 mm×156 mm solar cells today. The trend in crystalline silicon wafer solar cells is toward thinner and larger wafers. In a highly commoditized market with shrinking gross margins, any cost-effective, high-efficiency, innovative silicon solar cell technology which enables a substantial reduction of the silicon material consumption (e.g., wafer or film thickness) per $W_p$ of cell power may offer significant promise in myriad ways (e.g., residential, commercial, and industrial rooftop as well as large-scale centralized utilities electrical power generation applications).

Higher solar cell efficiencies have favorable effects on the entire solar cell value chain and levelized cost of energy (LCOE in $/kWh) due to reduced material consumption and cost as well as reduced balance-of-system (BOS) costs (e.g., area-related solar module installation and inverter costs). A key area for new solar cell business opportunities is development of innovative cell structures and simplified process flows which may drive efficiencies up while lowering overall solar cell and module manufacturing costs. For alternative (e.g., thin-film PV) approaches to succeed over the mainstream wafer-based crystalline silicon solar cell technologies, they should provide higher efficiencies at even lower manufacturing costs compared to the projected efficiency and cost numbers for the mainstream wafer-based crystalline silicon solar cells when the new technology is fully commercialized.

Economy-of-scale fab cost reduction associated with high-volume solar fab capacities is a key factor impacting LCOE. The state-of-the-art high-volume solar photovoltaic fabs have annual production capacities on the order of or in excess of 50 $MW_p$ to 100 $MW_p$ ($MW_p$=1 million $W_p$). High-volume solar photovoltaic fab capacities are expected to increase substantially to annual production rates of several hundred $MW_p$ or even approaching 1 $GW_p$ ($GW_p$=1 billion $W_p$) in the coming decade. While very-high-volume solar fabs in the range of 100 $MW_p$ to 1 $GW_p$ should facilitate longer term cost reductions (including LCOE) through high-volume manufacturing economies of scale, the relatively high initial fab investment costs, which may easily exceed $100M, may impose certain limits on solar photovoltaic fab construction options. Ideally, the preference may be to develop innovative crystalline silicon solar cell designs and simplified manufacturing processes which facilitate substantial manufacturing cost reductions in solar cells and modules even in smaller-scale (and less capital intensive) fabs with modest production volumes (e.g., annual production volumes in the range of 5 $MW_p$ to 50 $MW_p$). This type of technology would allow for modest-volume solar photovoltaic fabs with modest fab setup and operation costs. Reduced fab setup and operation costs would further facilitate global proliferation of cost-effective solar modules, enabling construction of a multitude of very affordable modest-volume fabs (in contrast to having to set up very expensive high-volume fabs in order to achieve sufficient economy of scale for manufacturing cost reduction). Of course, an innovative solar cell technology that meets the above-mentioned criteria for cost-effective, modest-volume fabs (i.e., meeting the LCOE roadmap requirements even at modest production volumes in low-cost fabs set up for simplified solar cell processing), may also be applicable to very-high-volume solar fabs. Such solar photovoltaic fabs can take further advantage of the economies of scale associated with increased volume.

Thin-film solar cell (TFSC) technologies (e.g., amorphous silicon, CdTe, and CIGS) require little absorber material (usually much less than 10 microns in thickness) to absorb typical standard "Air Mass 1.5" (AM-1.5) solar illumination due to absorption bands that are well matched to the solar spectrum. The TFSC absorber material may be deposited on inexpensive substrates such as glass or flexible metallic or non-metallic substrates. TFSCs typically offer low cost, reduced module weight, reduced materials consumption, and a capability for using flexible substrates, but are usually much lower in efficiency. In the case of prior art thin crystalline silicon films, there are a number of major problems and challenges with the use of flat silicon films (such as epitaxially grown silicon films with thicknesses below 50 microns) for low-cost, high-performance solar cells. These include: relatively low solar module efficiencies (typically 7% to 12%), field degradation of module efficiencies, scarce and expensive absorber materials (e.g., In and Se for CIGS and Te for CdTe), limited validation of system field reliability, and adverse environmental impact of non-silicon technologies such as CIS/CIGS and CdTe.

With regard to the prior art crystalline silicon (c-Si) thin-film solar cell (TFSC) technology, there are difficulties associated with sufficient surface texturing of the thin silicon film to reduce surface reflectance losses, while reducing the crystalline silicon film thickness. This places a limit on the minimum flat (co-planar) monocrystalline silicon thickness due to production yield and cell performance (efficiency) considerations. In the case of a flat or co-planar film, it is essential to use surface texturing since the reflectance of an untextured crystalline silicon film is quite excessive and results in substantial optical reflection losses and degradation of the external quantum efficiency. Thus, reduction of reflectance-induced photon losses in co-planar epitaxial silicon films requires effective surface texturing which itself places a limit on the minimum epitaxial silicon layer thickness. Depending on the film surface texturing requirements and processes, the minimum crystalline silicon layer thickness may be on the order of at least 10 microns (so that the texturing process does not break through any portions of the crystalline silicon layer).

In addition, substantially reduced mean optical path lengths in thin planar crystalline silicon films result in reduced photon absorption, particularly for photons with energies near the infrared band gap of silicon (800 to 1100 nanometers), resulting in reduced solar cell quantum efficiency (reduced short-circuit current or $J_{sc}$). This results in serious degradation of the solar cell efficiency due to reduced cell quantum efficiency and reduced $J_{sc}$. For instance, in a co-planar (flat) crystalline silicon absorber layer with thickness of 20 microns, a solar light beam impacting the cell at a near-normal angle would have an effective path length equal to the film thickness, far too short for the solar radiation photons with energies near the infrared band gap of silicon (i.e., with wavelengths of roughly 800 to 1100 nanometers) to be absorbed effectively in the silicon thin film. In fact, a reduction of the active cell silicon thickness to below roughly 50 microns results in appreciable reduction of $J_{sc}$ and the resulting solar cell efficiency, with this degradation effect rapidly accelerating when the silicon film thickness is reduced below roughly 20 microns. Thus, a co-planar thin crystalline silicon film may also require effective light trapping using both top surface texturing and rear surface back reflection of the light exiting the back surface of the crystalline silicon film in order to create effective optical path lengths equal to a large multiple of the crystalline silicon film thickness.

The prior art technologies using this approach mostly use either back reflection through internal reflection of the light at the crystalline silicon film/silicon substrate, or reflection from a blanket backside contact (such as a back surface field aluminum contact/mirror).

There is also the problem of lack of rigidity and mechanical support of the thin film during cell and module processing steps. This problem relates to the mechanical strength of a large-area (e.g., 200 mm×200 mm) thin silicon film. It is well known that reducing the large-area crystalline silicon wafer thickness to below 100 microns results in a substantial loss of cell substrate mechanical strength/rigidity, and such thin wafers tend to be flexible and very difficult to handle without breakage during cell fabrication process flow.

Large-area, co-planar (flat) crystalline silicon films thinner than, for instance, 50 microns must be properly mounted and supported on a cost-effective support or handle substrate in order to achieve acceptable yield for solar cell and module manufacturing. One approach is to grow and retain the thin epitaxial film on a relatively low-cost (e.g., metallurgical-grade) silicon substrate (over which the epitaxial layer is grown); however, this approach suffers from some inherent problems constraining the ultimate solar cell efficiency. Another approach is to release or lift off the epitaxial silicon film from its (reusable) parent silicon substrate and subsequently place it on a cheaper non-silicon support or handle substrate to provide mechanical strength through the solar cell process flow. This approach may suffer from any thermal coefficient of expansion (TCE) mismatch between the support/handle substrate and silicon film during any high-temperature oxidation and anneal processes, as well as potential contamination of the thin epitaxial silicon film from the non-silicon support substrate (both creating possible manufacturing yield and performance/efficiency degradation problems).

The cost of the monocrystalline silicon film growth process using silicon Epitaxy, particularly for thicker epitaxial films with thicknesses in excess of 30 microns is an additional issue which should be addressed. Using a relatively small epitaxial film thickness (in one embodiment, much below 30 microns) may lower the cost of Epitaxy to an attractive range. However, this would present various challenges for fabrication of planar silicon thin-film solar cells. As stated, thinner co-planar (flat) epitaxial films (e.g., in the range of much less than 30 microns) produce a number of problems and challenges, including a lack of film mechanical strength, constraints limiting effective surface texturing of thin silicon films for low surface reflectance and reduced optical reflectance losses, relatively short optical path lengths, and reduced cell quantum efficiencies. Effective light trapping is essential for enhanced thin-film c-Si solar cell efficiencies. The requirement for effective light trapping is based on a combination of front surface texturing and back surface mirror, while achieving sufficiently low surface recombination velocities (for high cell efficiencies). This is difficult to achieve in the co-planar (flat) c-Si thin film solar cells.

High-performance c-Si thin-film solar cells require some patterning steps or patterned processing steps (e.g., for formation of selective emitter, front side emitter or backside emitter wrap-through metallization contacts, backside base metallization contacts, etc.). These patterning steps are usually achieved using photolithography, screen printing, and/or shadow-mask deposition (e.g., shadow-mask sputtering or evaporation) processes. The use of photolithography and/or screen printing and/or shadow-mask deposition patterning steps usually increases the manufacturing process flow complexity and cost, and may also detrimentally impact the fabrication yield as well as the ultimate achievable solar cell efficiency.

BRIEF SUMMARY

Embodiments of the present disclosure are directed to systems and methods that are further described in the following description and claims. Advantages and features of embodiments of the present disclosure may become apparent from the description, accompanying drawings, and claims.

According to one embodiment of the present disclosure a thin-film solar cell (TFSC) which substantially addresses the problems identified above is provided.

Embodiments of the present disclosure also substantially address shortcomings of existing mainstream c-Si solar cell technology. This includes reducing the amount of polysilicon feedstock consumed per peak watt of solar power, and eliminating the kerf losses associated with sawing and slicing, thus substantially reducing the overall solar cell manufacturing cost.

Embodiments of the present disclosure also substantially address requirements for innovative solar cell structures and simplified process flows, increasing cell and module efficiencies while significantly lowering the overall solar cell and module manufacturing costs. A still further need exists for innovative c-Si solar cell designs and simplified self-aligned manufacturing processes which facilitate substantial solar cell and module cost reduction even in fabs with modest production volumes, enabling low to mid-volume solar cell fabs with modest fab setup and operation costs (thus achieving economies of scale for manufacturing cost reduction at substantially lower fab volumes than the prior art fabs).

Embodiments of the present disclosure also substantially address shortcomings of existing TFSC technology. This includes addressing difficulties associated with sufficient surface texturing of the thin planar silicon films to reduce surface reflectance losses, which currently places a limit on the minimum flat (co-planar) crystalline silicon thickness due to production yield and cell performance considerations. A still further need exists for effective light trapping based on a combination of front surface texturing and back surface mirror, while achieving low surface recombination velocities (for high cell efficiencies).

Additional shortcomings of existing TFSC technologies includes the problem of lack of rigidity and mechanical support of the thin film substrate during cell and module processing steps, thus, necessitating the use of support or handle substrates (made of silicon or another material) for the TFSC substrates. This further includes the cost of the epitaxial silicon film growth process, particularly for thicker epitaxial films required for planar crystalline silicon TFSCs. This further includes the requirement of multiple photolithography and/or screen printing and/or shadow-mask processing/patterning steps which usually increase the manufacturing process flow complexity and cost, and may also detrimentally impact the fabrication yield as well as the ultimate achievable solar cell efficiency.

BRIEF DESCRIPTION OF THE SEVERAL VIEWS OF THE DRAWINGS

For a more complete understanding of the present disclosure and the advantages thereof, reference is now made to the following description taken in conjunction with the accompanying drawings in which like reference numerals indicate like features and wherein.

DETAILED DESCRIPTION OF THE ILLUSTRATIVE EMBODIMENTS

Illustrative embodiments of the present disclosure are illustrated in the FIGURES, like numerals being used to refer to like and corresponding parts of the various drawings.

A method operable to create reusable templates for detachable thin film (TF) substrates is provided.

Embodiments of the present disclosure provide a process operable to create a 3-dimensional substrate from a template, so as to transfer the reverse pattern of the template. The 3-dimensional substrate is shaped such that the 3-D shape repeats after each substrate release, thereby ensuring an identical substrate for each reuse. Both the top and bottom of the template are rounded with greater than 45 deg. angles (+/−20) and side walls are kept at greater than 20 deg. (+/−15 deg). This creates a profile which is optimized for minimum shape change during the process of forming conformal porous silicon layer (consumed during each reuse) as well as optimum for solar cells. One embodiment provides a free standing 125 mm×125 mm substrate as thin as 40 μm flat equivalent epitaxial (henceforth, epi) Si.

Embodiments of the present disclosure create a thin sacrificial layer (porous silicon) on which epitaxial silicon or other thin film is deposited. The thin substrate is then detached, along with removal of sacrificial layer. One of the challenges is that in prior art designs the vertical and horizontal dimensions of the template change. Thus after 5-10 reuses, the dimension of substrate width and height may change significantly so as to change the shape of released substrate, thereby making it of different dimension which may compromise its performance.

Figure 1A:
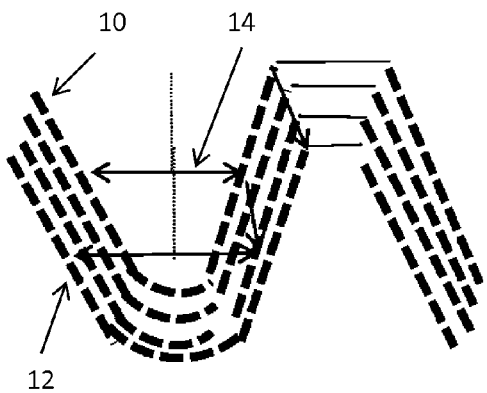
FIG. 1A is a diagram showing how prior art templates allow the dimension of substrate width and height to change so as to change the shape of released substrate.

FIG. 1A is a diagram showing how prior art templates result in the dimensions of substrate width and height changing. The initial surface of the template is shown by curve 10, and successive reuses lead to the surface changing to the one shown by curve 12. This will result in a change in shape and performance of the release solar cell after several reuses. In particular, critical dimension 14 changes markedly after each reuse, because of the flat top shown in FIG. 1A.

Figure 1B:
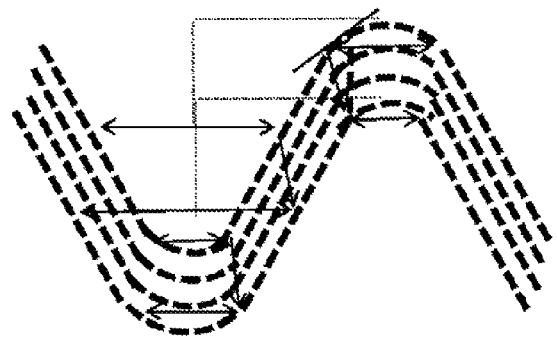
FIGS. 1B and 1C provide diagrams showing how embodiments of the present disclosure substantially prevent the dimension of substrate width and height from changing during reuse so as to maintain a consistent shape of the released TF and released substrate.
Figure 1C:
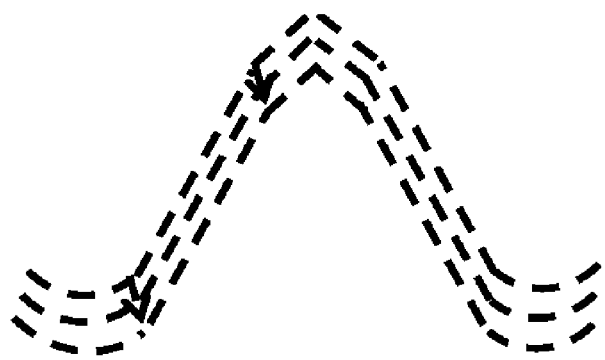

FIGS. 1B and 1C show analogously how embodiments of the present disclosure substantially prevent the dimensions of substrate width and height to change during reuse so as to maintain a consistent shape of the released TF substrate. In the present disclosure, new patterns are considered, with geometric angles which minimize the change of dimensions with reuse.

As seen in the FIG. 1A there is significant change in horizontal and vertical dimension after each reuse. (See dotted lines which mark for the geometry of the template after consecutive reuses.)

The substrates shown in FIGS. 1B and 1C have a tapered profile and a rounded top and bottom. These profiles may tend to minimize the change in dimension as shown. FIG. 1C shows a post-oxide embodiment with a tapered top and a faceted bottom.

A tapered profile may be created by following approaches or combination of processes:
 (1) Deep RIE etch or wet etch (of Si)
 (2) Increasing isotropic component of etch
 (3) Dry wet etch combination.

Subsequent process sequence may be used:
 (1) Template etch to create profile which does not change after complete release cycle
 (2) Sacrificial porous Si layer
 (3) Epitaxial silicon deposition
 (4) Release of the epitaxial layer
 (5) Reuse of the template.

Figure 2:
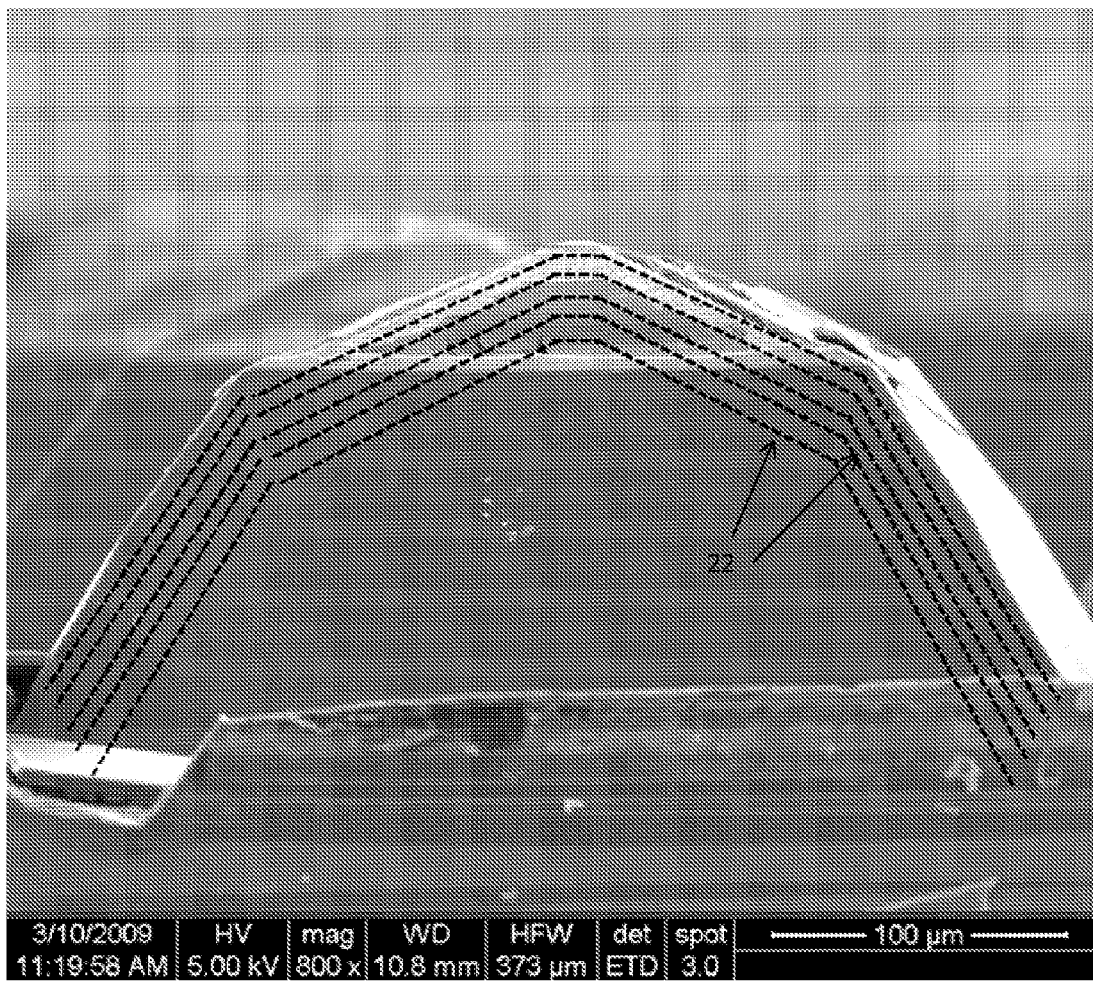
FIGS. 2-3 provide scanning electron micrographs (SEMs) of an alternate taper having a pyramidal style with a varying top/mid and bottom taper that allows for improved reusability in accordance with embodiments of the present disclosure.
Figure 3:
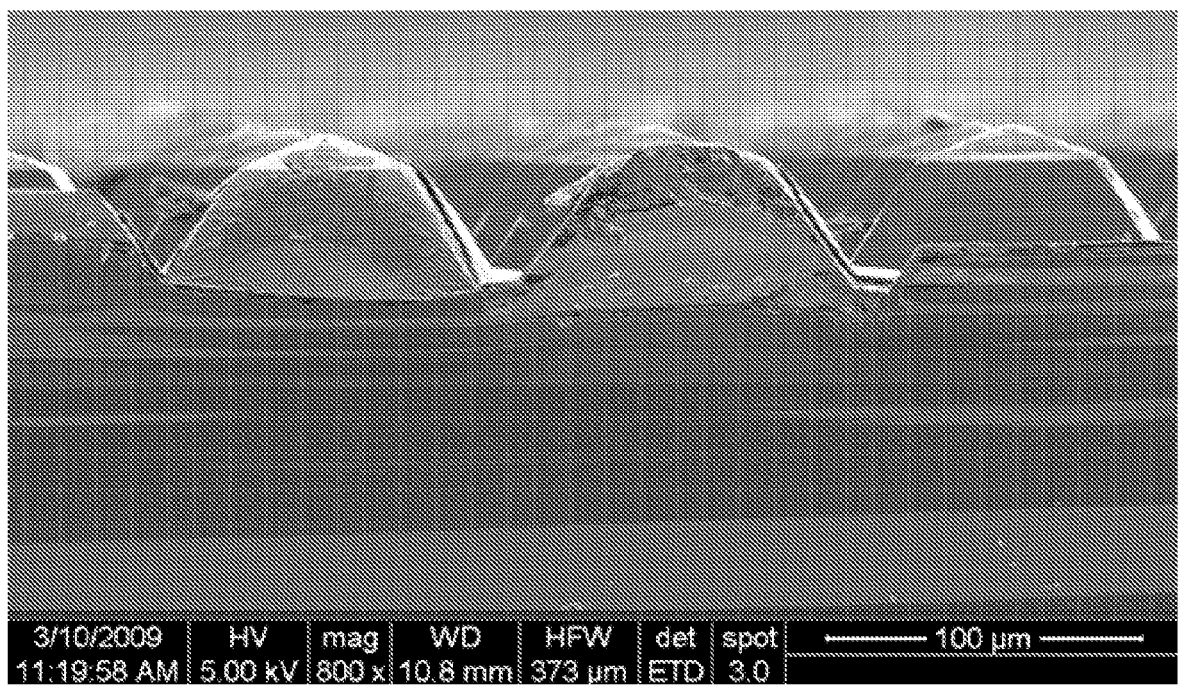
Figure 4:
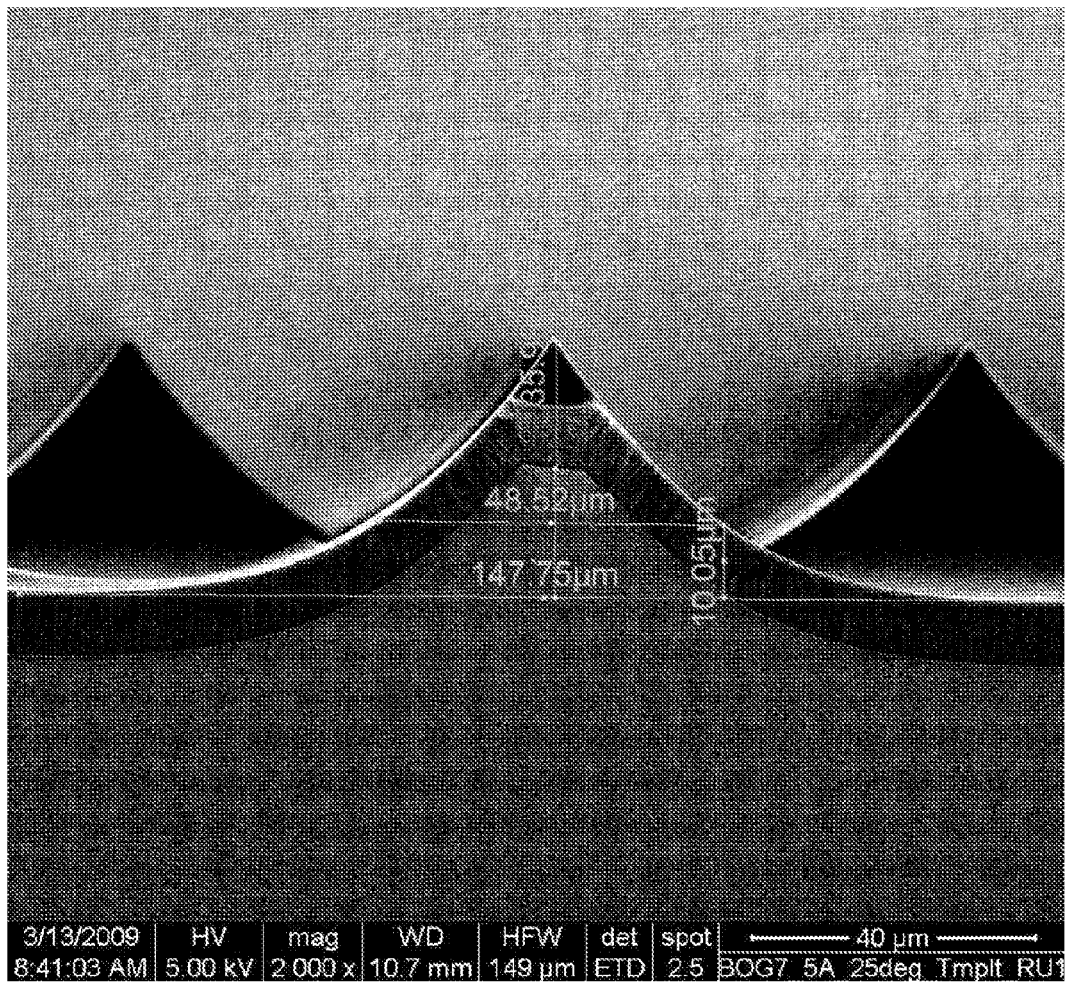
FIGS. 4-7 provide scanning electron micrographs (SEMs) of an alternate taper having a pyramidal style that allows for improved reusability in accordance with embodiments of the present disclosure.
Figure 5:
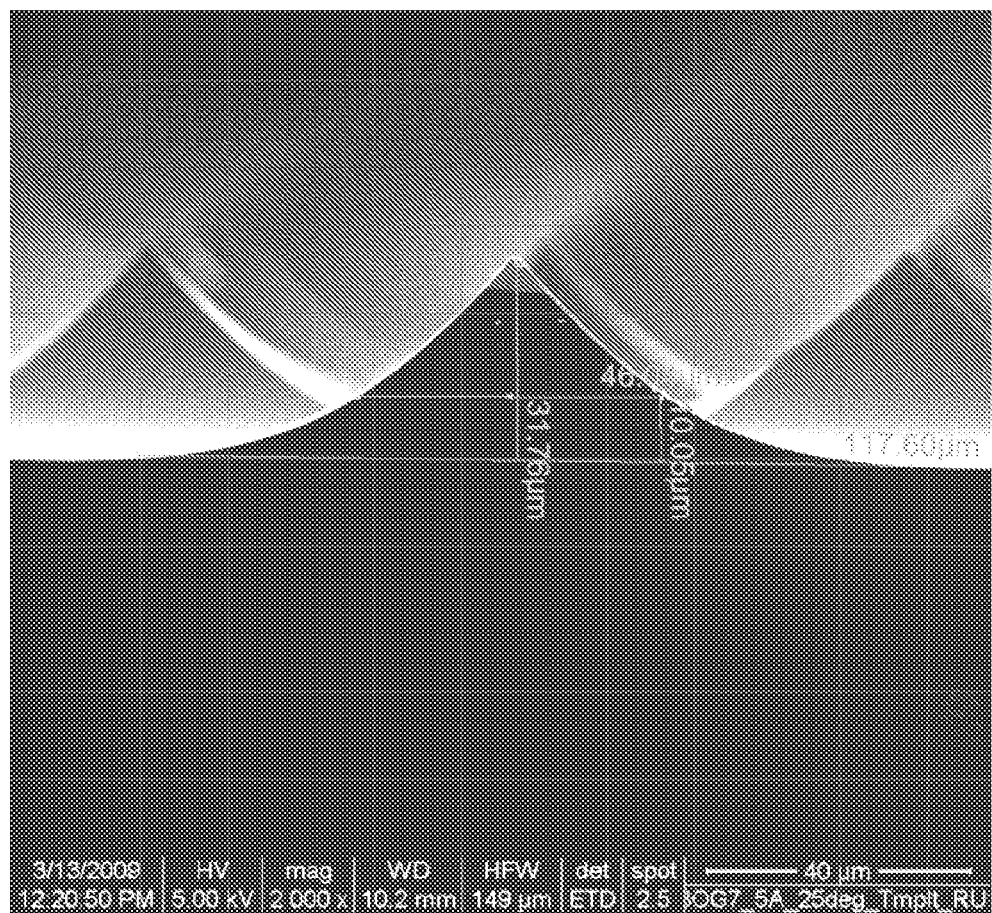

As shown in FIGS. 2 and 3, a profile with a sharp taper at top may be created. Dashed lines 22 show that the same profile is retained after each reuse. (Each dashed line represents one reuse of the template.) The change in critical dimension (CD) is limited to middle profile region with sharper angle, which can be further improved.

Figure 6:
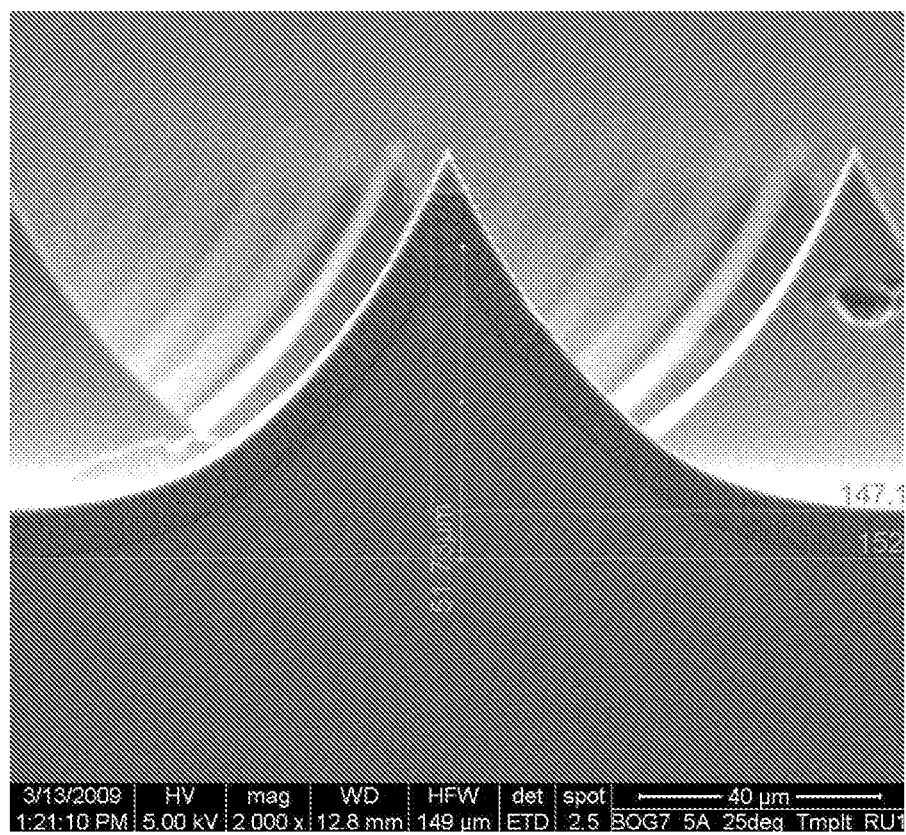
Figure 7:
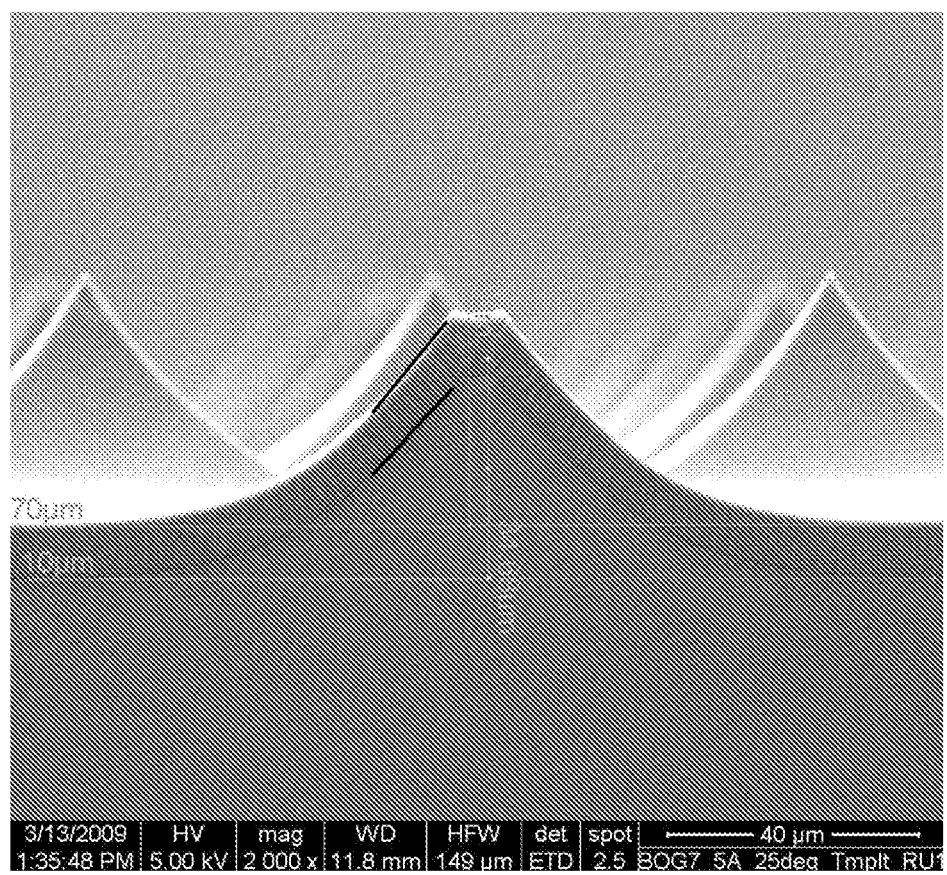
Figure 8:
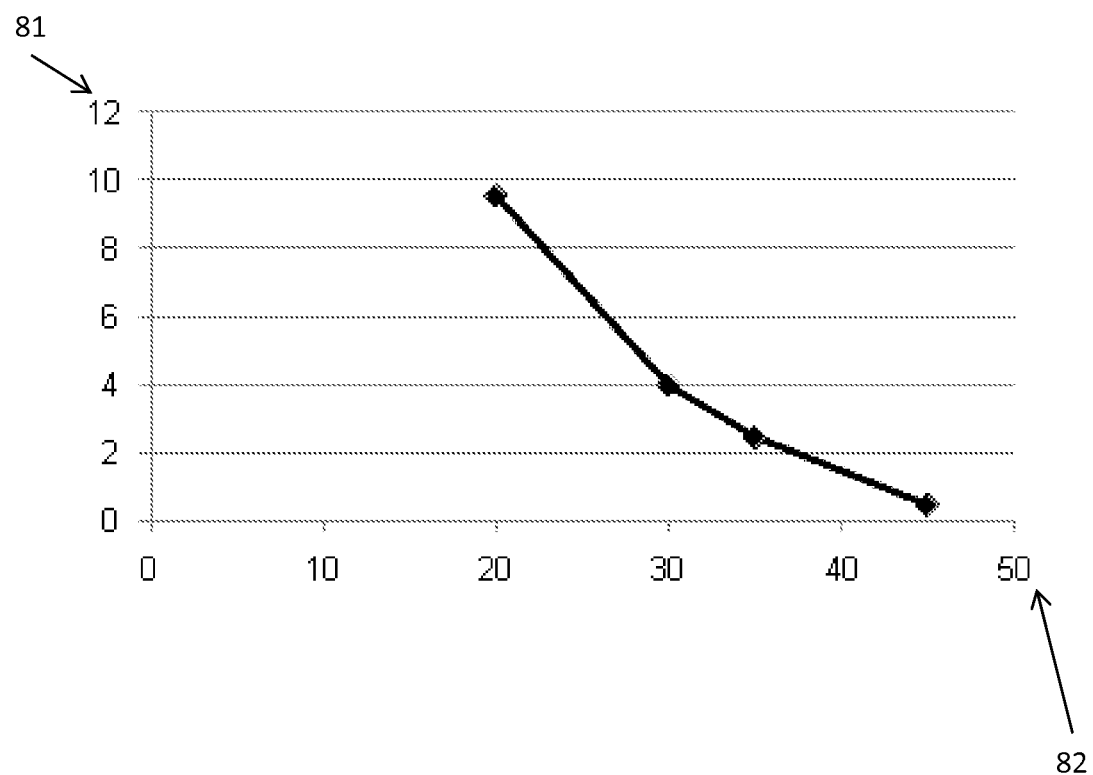
FIG. 8 is a graph showing height reduction stabilization, as the shape becomes increasingly more tapered in accordance with embodiments of the present disclosure.

FIGS. 4-7 provide scanning electron micrographs (SEMs) of an alternate taper having a pyramidal style that allows for improved reusability in accordance with embodiments of the present disclosure. The concern, as shown in FIG. 8, is height reduction which gets stabilized, as the shape becomes increasingly more tapered. FIG. 8 demonstrates the dependence of height loss 81 as a function of taper angle 82 (after three template reuses). A sharper angle, as shown in FIG. 6, may tend to have a larger height loss during each reuse cycle, as compared to a tapered template, as shown in FIG. 7.

Figure 9:
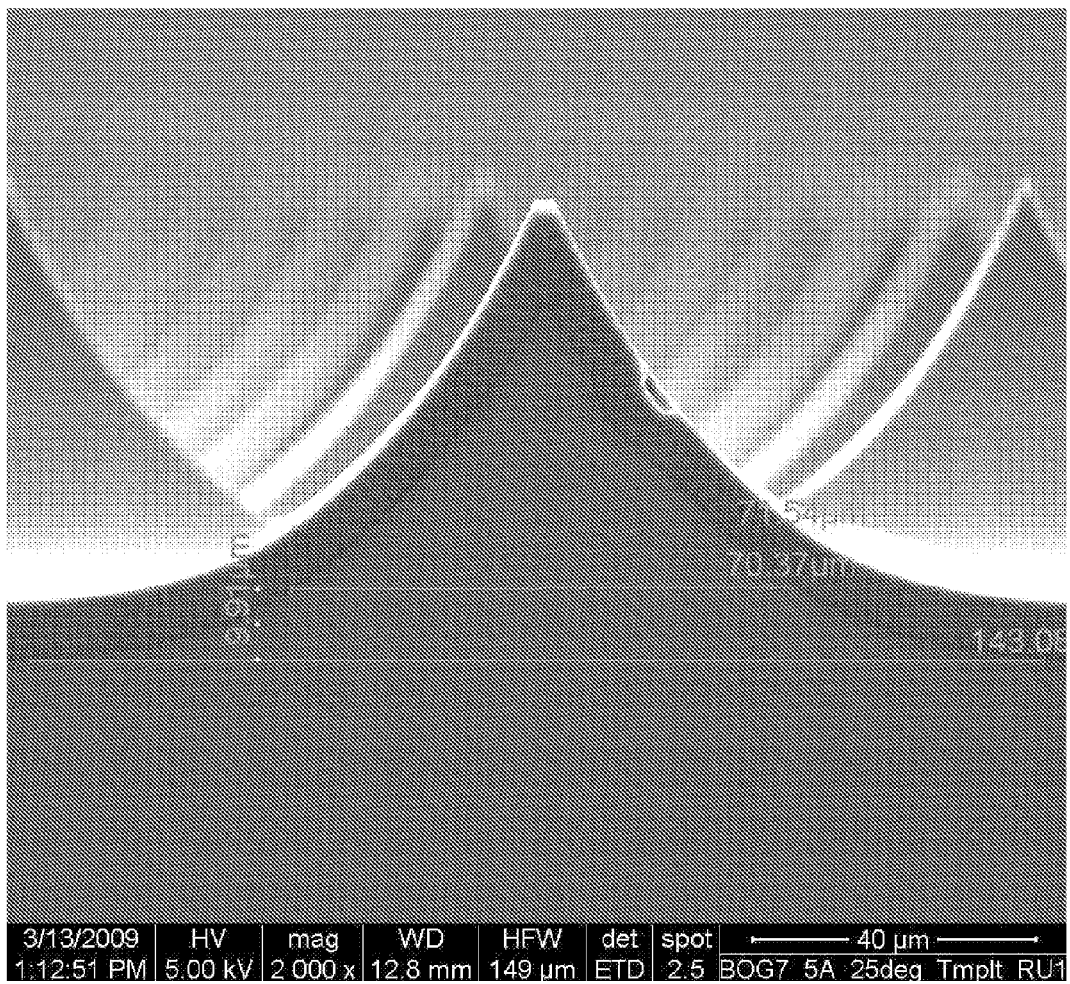
FIGS. 9-11 shows reusable profile created out of the template in accordance with embodiments of the present disclosure.
Figure 10:
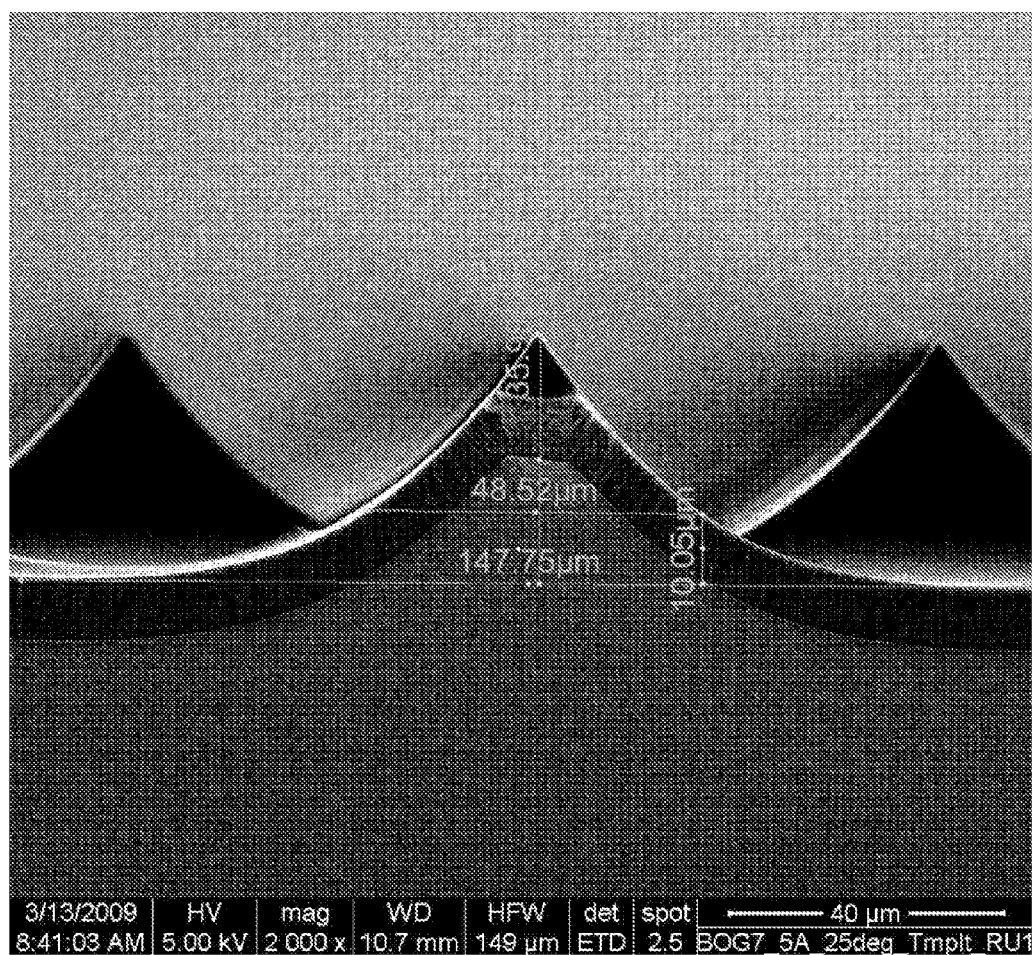
Figure 11:
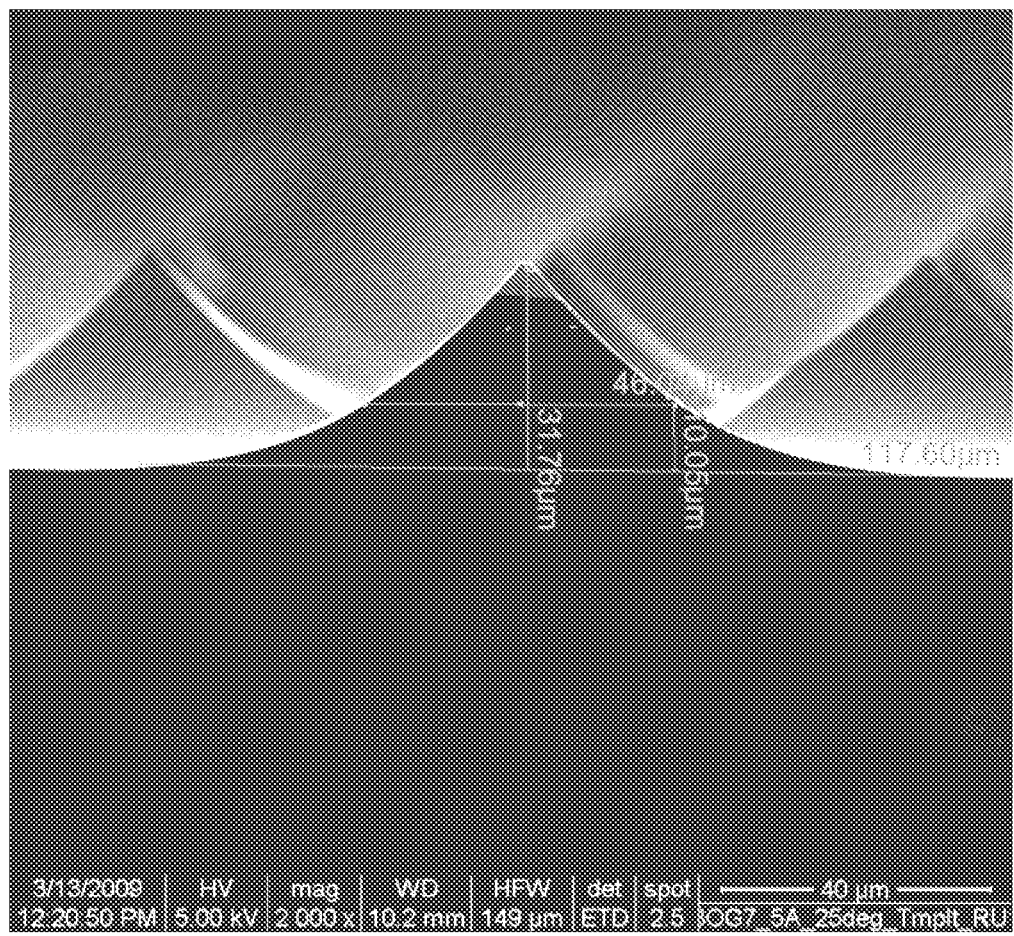

FIGS. 9-11 show reusable profiles created out of the template in accordance with embodiments of the present disclosure. The shape may be adjusted so as to allow for the thinnest possible substrate which is free-standing at a flat equivalent thickness of 30-40 μm or lower.

Figure 12:
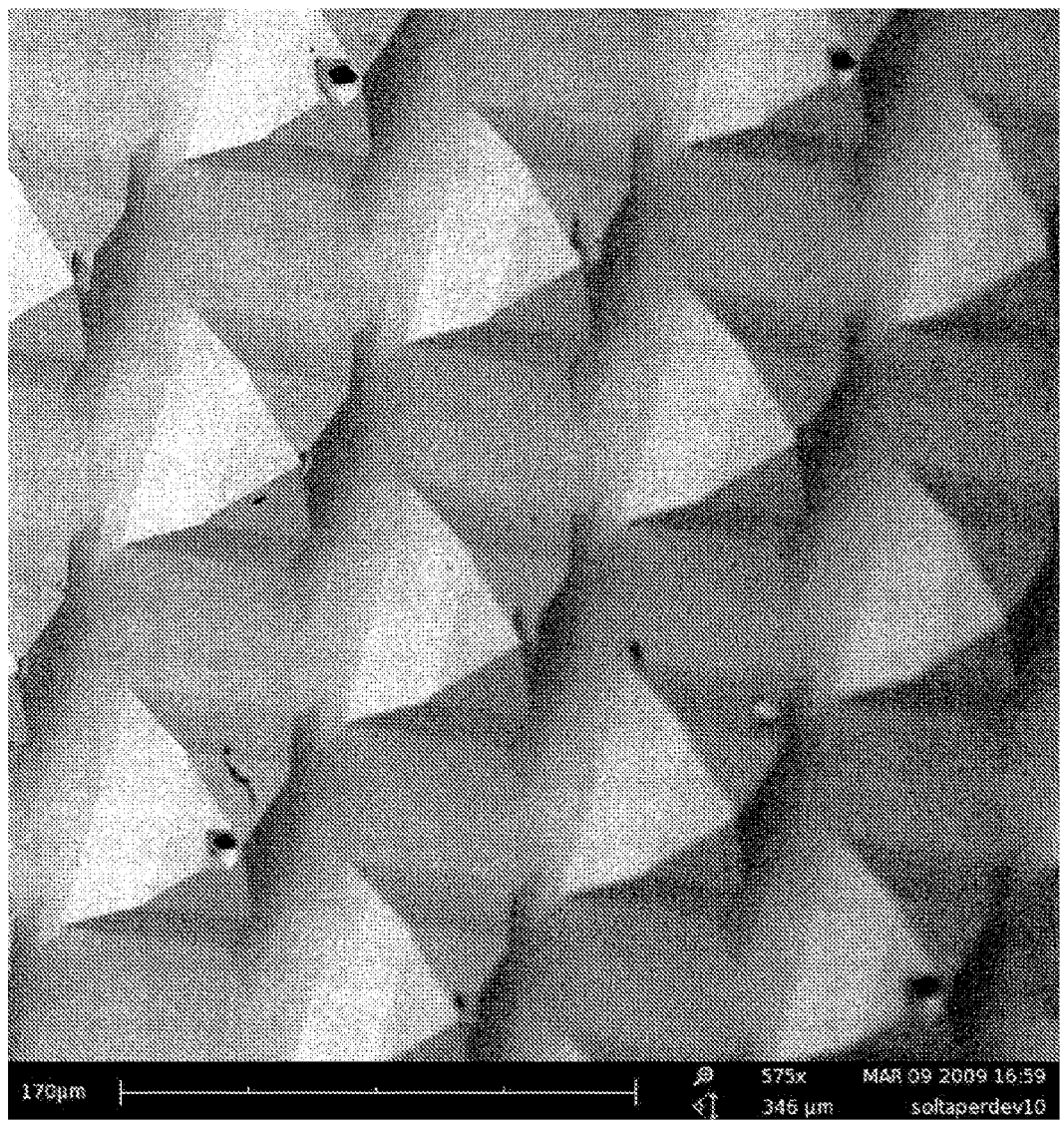
FIGS. 12-14 provide SEMs of a reusable profile having a varying top/mid and bottom taper in accordance with embodiments of the present disclosure.
Figure 13:
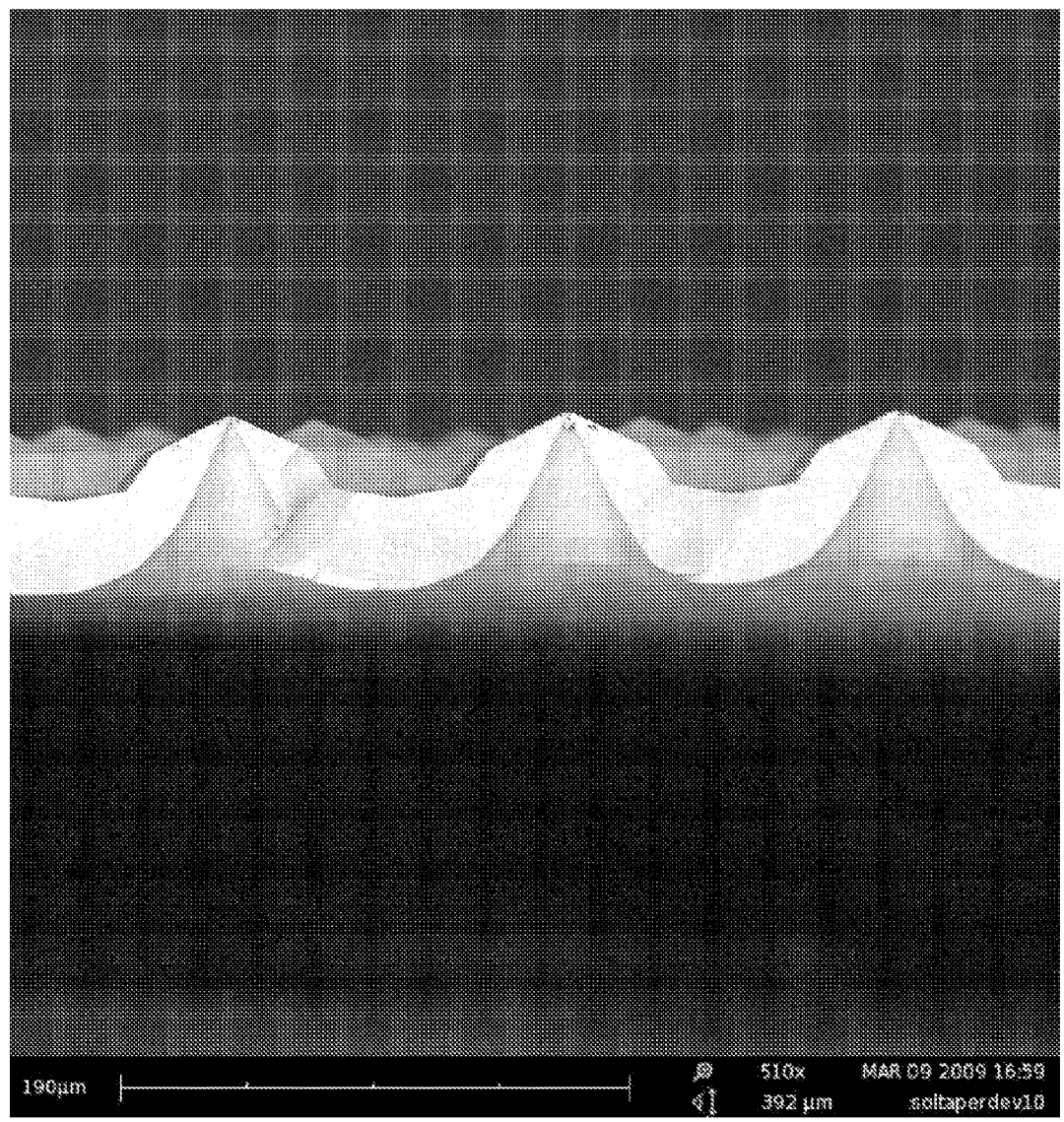
Figure 14:
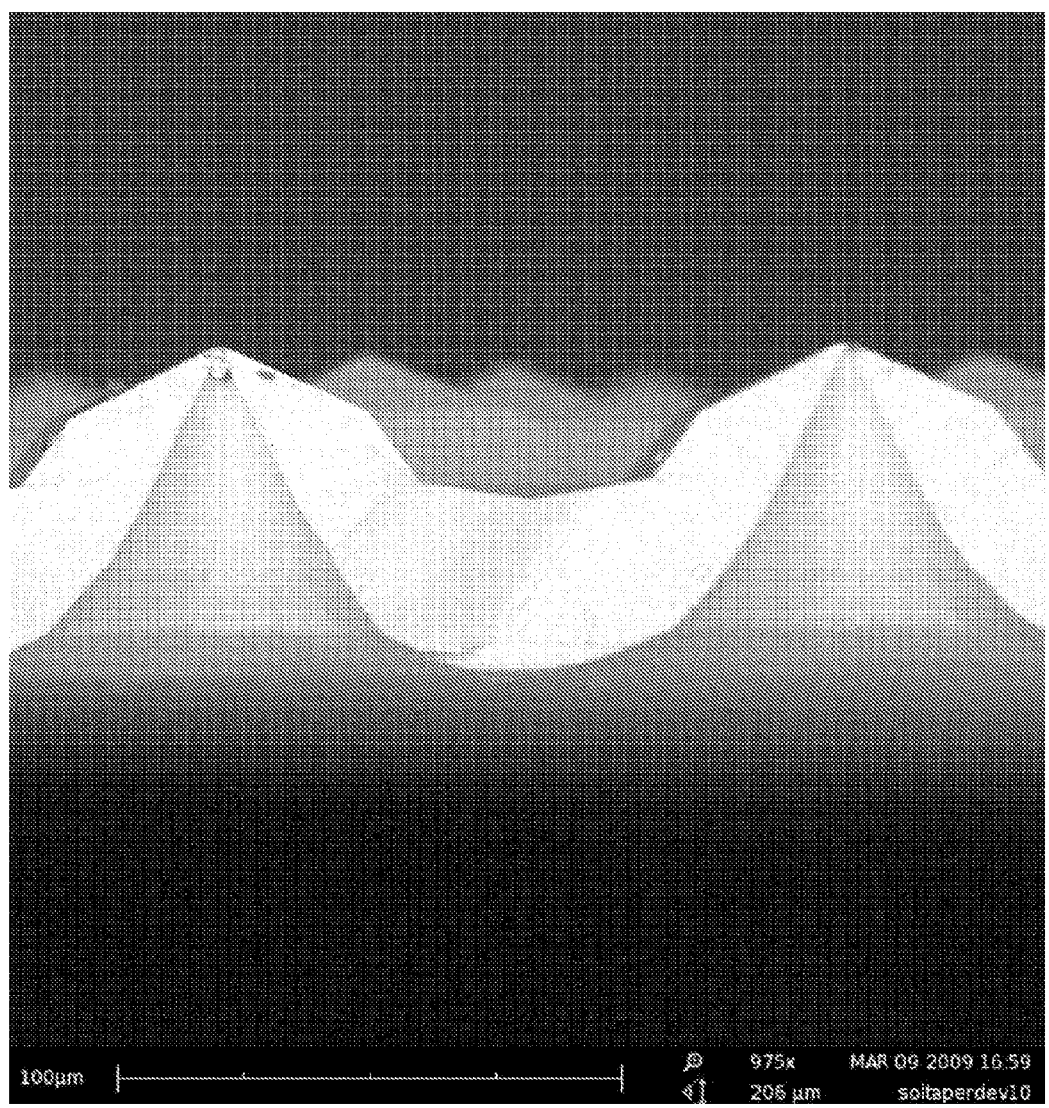

FIGS. 12-14 provide SEMs of a reusable profile having a varying top, middle, and bottom taper in accordance with embodiments of the present disclosure. The profile shape change may be minimized during several reuses, which makes it possible for it to be used for 1-50 reuses. The profile allows for maximum strength, tailoring by changing the profile to improve EPI side wall thickness, shape of prism, still giving rigid frame, thus enabling free standing TFSS. The profile is also tailored for maximizing light trapping, thus creating substrates which may allow for maximum light coupling and enabling high efficiency.

Figure 15:
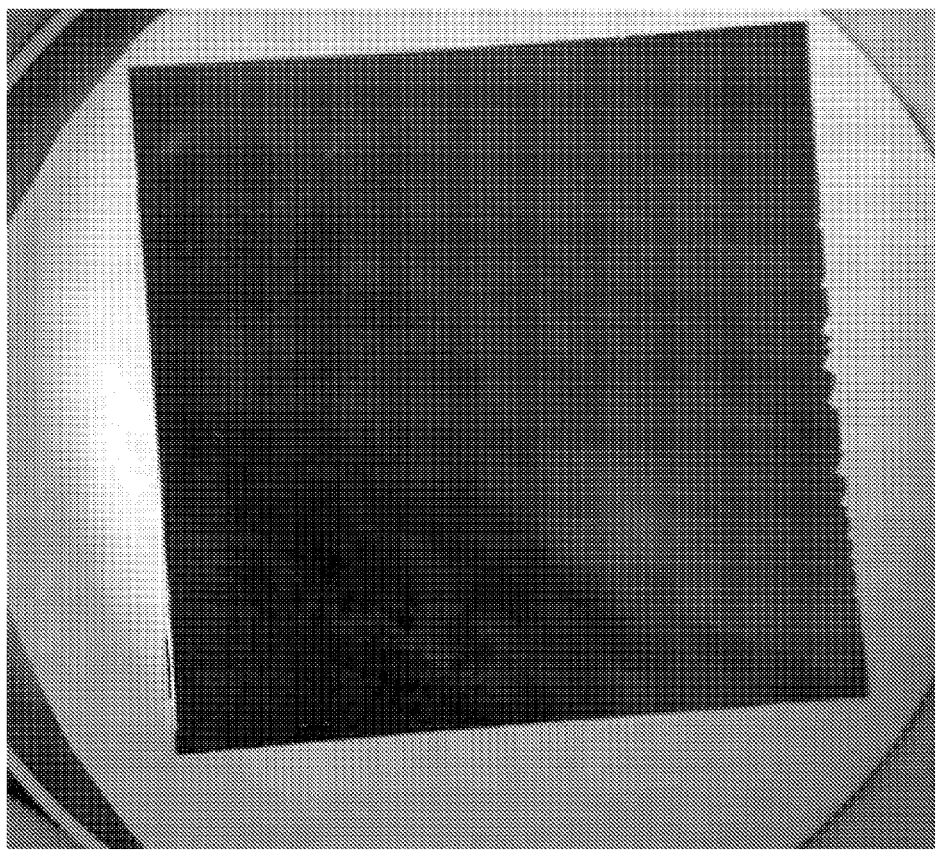
FIG. 15 provides a picture of a substrate having dimensions 125 mm×125 mm in accordance with embodiments of the present disclosure.

FIG. 15 provides a picture of a substrate having dimensions 125 mm×125 mm in accordance with embodiments of the present disclosure.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A reusable template for creating a plurality of detachable thin semiconductor substrates comprising:
   a semiconductor material comprising silicon;
   a surface having a three-dimensional (3-D) surface topography comprising a plurality of raised areas comprising a rounded top, said raised areas separated by a plurality of depressed areas;
   wherein said 3-D surface topography is substantially preserved after a plurality of substrate release cycles.

2. The reusable template of claim 1, wherein each of said plurality of raised areas comprises a tapered top having an angle selected from the range consisting of 25 degrees to 65 degrees.

3. The reusable template of claim 2, wherein each of said plurality of depressed areas comprises a rounded depressed area.

4. The reusable template of claim 3, further comprising a plurality of feature side wall taper angles, each of said feature side wall taper angles being between selected from the range consisting of 5 degrees to 35 degrees.

5. The reusable template of claim 1, wherein each of said plurality of depressed areas comprises a rounded depressed area.

6. The reusable template of claim 5, further comprising a plurality of feature side wall taper angles, each of said feature side wall taper angles being selected from the range consisting of 5 degrees to 35 degrees.

* * * * *